(12) United States Patent
Jaster

(10) Patent No.: US 10,593,504 B2
(45) Date of Patent: Mar. 17, 2020

(54) CIRCUIT ARRANGEMENT

(71) Applicant: Continental Automotive GmbH, Hannover (DE)

(72) Inventor: Magnus Jaster, Kirchmöser (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 16/340,820

(22) PCT Filed: Oct. 5, 2017

(86) PCT No.: PCT/EP2017/075343
§ 371 (c)(1),
(2) Date: Apr. 10, 2019

(87) PCT Pub. No.: WO2018/069141
PCT Pub. Date: Apr. 19, 2018

(65) Prior Publication Data
US 2019/0267207 A1 Aug. 29, 2019

(30) Foreign Application Priority Data
Oct. 14, 2016 (DE) .................. 10 2016 220 058

(51) Int. Cl.
*H01H 85/47* (2006.01)
*H01H 85/00* (2006.01)
(Continued)

(52) U.S. Cl.
CPC ........ *H01H 85/47* (2013.01); *H01H 85/0017* (2013.01); *H01H 85/175* (2013.01);
(Continued)

(58) Field of Classification Search
CPC .. H01H 85/47; H01H 85/2025; H01H 85/175; H01H 85/0017; H01H 61/02;
(Continued)

(56) References Cited

U.S. PATENT DOCUMENTS 3,585,556 A   6/1971   Hingorany et al. .......... 337/297
3,793,603 A   2/1974   Fontaine ....................... 337/166
(Continued)

FOREIGN PATENT DOCUMENTS

CN   1153577 A    7/1997   ............. H01C 17/08
CN   1240050 A   12/1999   ............... H01C 7/02
(Continued)

OTHER PUBLICATIONS

German Office Action, Application No. 10 2016 220 058.5, 6 pages, dated Jun. 23, 2017.
(Continued)

*Primary Examiner* — Jayprakash N Gandhi
*Assistant Examiner* — Stephen S Sul
(74) *Attorney, Agent, or Firm* — Slayden Grubert Beard PLLC

(57) ABSTRACT

Various embodiments include a fuse electrically connecting two connection regions comprising: a heat sink; a set of layers arranged on a surface of the heat sink, the set of layers including an electrically insulating layer arranged on the heat sink and an electrically conductive conductor layer arranged on a side of the insulation layer facing away from the heat sink; and an electrical connecting path between the connection regions. The surface of the heat sink defines two material cutouts. A portion of the heat sink arranged between the material cutouts forms a bridge element. The set of layers is disposed on the bridge element.

10 Claims, 4 Drawing Sheets

(51) Int. Cl.
*H01H 85/175* (2006.01)
*H01H 85/20* (2006.01)
*H01L 23/46* (2006.01)
*H01L 23/62* (2006.01)
*H01L 23/367* (2006.01)

(52) U.S. Cl.
CPC ......... *H01H 85/2025* (2013.01); *H01L 23/46* (2013.01); *H01L 23/62* (2013.01); *H01L 23/367* (2013.01)

(58) Field of Classification Search
CPC ............... H01H 61/04; H01H 85/0047; H01H 85/0052; H01H 85/0056; H01L 23/62; H01L 23/46; H01L 23/367
USPC .......................................... 337/142, 158, 166
See application file for complete search history.

(56) References Cited

U.S. PATENT DOCUMENTS

| | | | |
|---|---|---|---|
| 3,810,063 A | 5/1974 | Blewitt | 337/166 |
| 4,839,625 A | 6/1989 | Newbery et al. | 337/166 |
| 5,552,757 A | 9/1996 | Blecha et al. | 337/297 |
| 6,204,083 B1* | 3/2001 | Kodato | G01J 3/108 |
| | | | 438/43 |
| 6,269,745 B1 | 8/2001 | Cieplik et al. | 102/202.5 |
| 6,566,995 B2* | 5/2003 | Furuuchi | H01L 23/5256 |
| | | | 257/E23.149 |
| 8,659,384 B2* | 2/2014 | Dietsch | H01H 85/0411 |
| | | | 337/290 |
| 8,957,755 B2* | 2/2015 | Lu | H01H 85/0411 |
| | | | 337/292 |
| 9,129,769 B2* | 9/2015 | Wang | H01H 85/0241 |
| 2004/0184211 A1* | 9/2004 | Bender | H01H 69/022 |
| | | | 361/104 |
| 2007/0075822 A1 | 4/2007 | Pachla et al. | 337/297 |
| 2008/0218305 A1 | 9/2008 | Bender et al. | 337/297 |
| 2009/0021338 A1* | 1/2009 | Kim | G11C 17/16 |
| | | | 337/227 |
| 2014/0240082 A1 | 8/2014 | Zheng et al. | 337/231 |
| 2014/0266565 A1 | 9/2014 | Enriquez et al. | 337/297 |
| 2018/0192511 A1* | 7/2018 | Tsumagari | H05K 1/0293 |
| 2018/0294125 A1* | 10/2018 | Yoneda | H01H 85/11 |
| 2019/0013167 A1 | 1/2019 | Sherrima | |

FOREIGN PATENT DOCUMENTS

| | | | | |
|---|---|---|---|---|
| CN | 1246958 A | 3/2000 | | H01H 85/00 |
| DE | 20 2009 017 813 U1 | 8/2010 | | H01H 85/143 |
| DE | 20 2015 101 661 U1 | 8/2016 | | H01H 85/046 |
| FR | 865185 A | 5/1941 | | H01H 85/046 |
| GB | 1221387 A | 2/1971 | | H01H 85/47 |
| GB | 2 026 247 A | 1/1980 | | H01H 37/76 |
| JP | 2009-267371 A | 11/2009 | | H01H 69/02 |
| WO | 2018/069141 A1 | 4/2018 | | H01H 85/00 |

OTHER PUBLICATIONS

International Search Report and Written Opinion, Application No. PCT/EP2017/075343, 15 pages, dated Jan. 29, 2018.
Chinese Office Action, Application No. 201780058611.3, 6 pages, dated Sep. 4, 2019.

\* cited by examiner

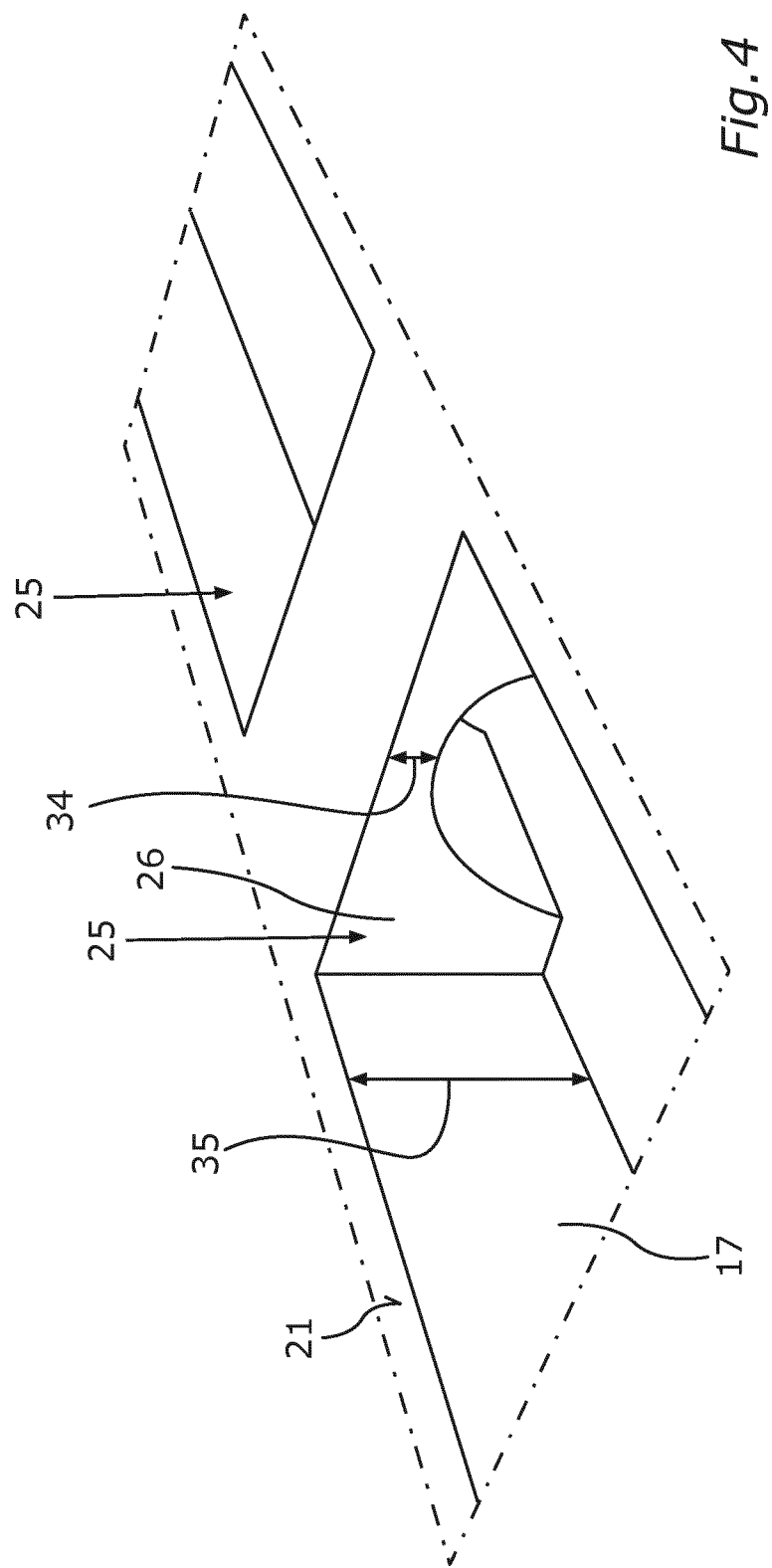

US 10,593,504 B2

CIRCUIT ARRANGEMENT

CROSS-REFERENCE TO RELATED APPLICATIONS

This application is a U.S. National Stage Application of International Application No. PCT/EP2017/075343 filed Oct. 5, 2017, which designates the United States of America, and claims priority to DE Application No. 10 2016 220 058.5 filed Oct. 14, 2016, the contents of which are hereby incorporated by reference in their entirety.

TECHNICAL FIELD

The present disclosure relates to circuit arrangement and fuses. Various embodiments include fuses between two connection regions of a circuit arrangement, motor vehicles in which a voltage source and a high-current load are connected by a circuit arrangement, and/or methods for manufacturing a circuit arrangement.

BACKGROUND

In a motor vehicle, it may be necessary to provide a high-current fuse in the electrical system of said motor vehicle, which high-current fuse can carry a continuous current without tripping and nevertheless exhibits quick response behavior when a maximum current threshold is exceeded. Fuses which are qualified for this purpose are generally relatively large and therefore constitute a selective mass which begins to oscillate in the event of vibrations and as a result can break, for example, solder connections in a motor vehicle for example.

SUMMARY

The present disclosure describes circuit arrangements comprising a fuse for a vibratory application environment. For example, some embodiments include a circuit arrangement (15) comprising a fuse (16) which electrically connects two connection regions (22, 23), having: a heat sink (17) and a layer arrangement (20), which is arranged on a surface (21) of the heat sink (17) and which has an electrically insulating insulation layer (27) which is arranged on the heat sink (17), and an electrically conductive conductor layer (28), which is arranged on a side of the insulation layer (27) that faces away from the heat sink (17), wherein an electrical connecting path (24) between the connection regions (22, 23) is provided by the layer arrangement (20), characterized in that, for the purpose of providing the fuse (16), the surface (21) of the heat sink (17) has two material cutouts (25) and a bridge element (26) is formed by a portion of the heat sink (17) that is arranged between the material cutouts (25) and the layer arrangement (20) is guided across the bridge element (26).

In some embodiments, the layer arrangement (20) has at least one melting layer (29) which is arranged on the conductor layer (28) and is composed of an electrically insulating melting material which has a melting point in a region greater than 400° C.

In some embodiments, the at least one melting layer is porous.

In some embodiments, the layer arrangement (20) has a shell layer (30) which delimits the layer arrangement (20) with respect to a surrounding area and is composed of an electrically insulating material, wherein the shell layer (30) is connected to the insulation layer (27) along a profile of the electrical connecting path (24) on either side of the connecting path (24).

In some embodiments, the material cutouts (25) are filled with air.

In some embodiments, the bridge element (26) has a thickness (34), measured perpendicular in relation to the surface (21), which is smaller than a thickness (35) of the heat sink (17) in a region adjoining the bridge element (26).

In some embodiments, at least one cooling duct (18) for carrying a cooling medium (19) is provided in or on the heat sink (17).

In some embodiments, a material of the conductor layer (28) is porous at least in the region of the bridge element (26).

As another example, some embodiments include a motor vehicle (10) comprising an electrical voltage source (13) and comprising at least one high-current load (11) which has an operating current (14) of greater than 10 A, characterized in that the voltage source (13) and the at least one high-current load (11) are electrically connected by means of a circuit arrangement (15) as claimed in one of the preceding claims.

As another example, some embodiments include a method for manufacturing a circuit arrangement (15) comprising a fuse (16), wherein a layer arrangement (20) comprising an insulation layer (27), which is arranged on the heat sink (17) and is composed of an electrically insulating material, and a conductor layer (28), which is arranged on a side of the insulation layer (27) that faces away from the heat sink (17) and is composed of an electrically conductive material, is produced on a surface (21) of a heat sink (17) by means of cold gas spraying, wherein an electrical connecting path (24) between two connection regions (22, 23) is provided by the layer arrangement (20), characterized in that, for the purpose of providing the fuse (16), the surface (21) of the heat sink (17) is provided with two material cutouts (25), so that a bridge element (26) is formed by a portion of the heat sink (17) that is arranged between the material cutouts (25), and the layer arrangement (20) is entirely or partially produced on the bridge element (26).

BRIEF DESCRIPTION OF THE DRAWINGS

An exemplary embodiment of the teachings herein is described below. In this regard, in the figures:

FIG. 4 shows a schematic illustration of a side view of the bridge element of the circuit arrangement from FIG. 2.

DETAILED DESCRIPTION

Figure 1:
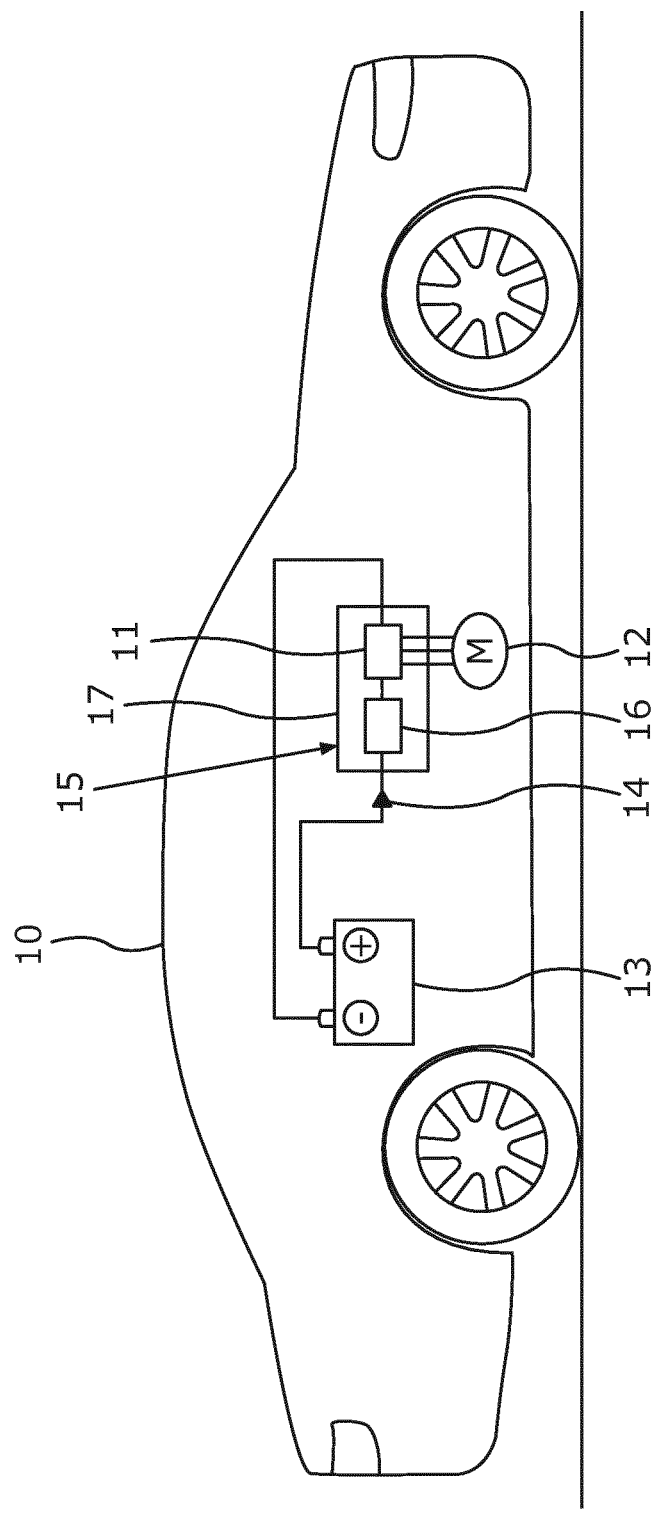
FIG. 1 shows a schematic illustration of an embodiment of the motor vehicle incorporating teachings of the present disclosure.

In some embodiments, a circuit arrangement incorporating teachings of the present disclosure provides an electrical connection comprising a fuse between two connection regions. In some embodiments, the fuse is configured as a layer arrangement, that is to say as a component which is distributed in a planar fashion and as a result has a mass which is distributed over the layer arrangement and tends to oscillate less than a selectively concentrated mass in the event of excitation by vibrations. In order to realize the fuse, a heat sink is provided, the layer arrangement being arranged on the surface of said heat sink. Here, the layer arrangement comprises an electrically insulating layer, which is arranged on the heat sink, that is to say on the surface of said heat sink, and is referred to as the insulation layer here, and an electrically conductive layer, which is arranged on said insulation layer, that is to say on a side of the insulation layer that faces away from the heat sink, and is referred to as the conductor layer here. Here, electrically insulating means that a conductivity of a material of the insulation layer is lower than 10−4 S/m, in particular lower than 10−7 S/m. Electrically conductive means that a material of the conductor layer has an electrical conductivity which is greater than 10 000 S/m, in particular greater than 100 000 S/m.

In some embodiments, the layer arrangement comprising the insulation layer and the conductor layer, which layer arrangement is arranged on the heat sink, provides an electrical connecting path or current path between the connection regions. In order to now design, in a targeted manner, a melting region for providing the fuse, the surface of the heat sink has two holes or material cutouts or holes. Material of the heat sink is further located between these two material cutouts, that is to say a bridge element is formed by a portion of the heat sink that is arranged between the material cutouts and said bridge element is guided through between the two material cutouts and connects two surface regions on either side of the material cutouts. The layer arrangement is guided through across said bridge element. In other words, a portion of the layer arrangement rests on the bridge element. In particular, the layer arrangement between the two material cutouts is as wide as the bridge element itself.

In some embodiments, a planar layer arrangement is provided between the two connection regions on a heat sink and said planar layer arrangement functions as a fuse. Therefore, there is no concentrated component, which could tend to perform natural oscillations, as the fuse. The heat sink can be used as a rigid carrier element and be formed, for example, from metal, in particular aluminum or an aluminum alloy. This reinforces the layer arrangement and ensures thermal conductivity. In the event of current flow through the conductor layer, heat loss which is implemented therein can be transferred to the heat sink in a planar fashion. However, owing to the material cutouts, there is a build-up of heat or a concentration of heat in the region of the bridge element, with the result that the heat cannot propagate from the bridge element over the material of the heat sink in all directions. A melting point can be defined, that is to say a current intensity at which the conductor layer melts can be set, by adjusting the width of the bridge element, the conductor layer thickness and the conductor material.

In some embodiments, the layer arrangement is manufactured by a method incorporating the teachings herein, by means of which method the material of the insulation layer and of the conductor layer is applied to the heat sink in layers by means of cold gas spraying (CGDM—Cold Gas Dynamic Method) on the surface of the heat sink. As a result, granules or powder, which constitute the respective material of the insulation layer and of the conductor layer, mesh with and/or melt on the heat sink. Therefore, the layer arrangement comprising the insulation layer, which is arranged on the heat sink by means of an electrically insulating material, for example a ceramic or aluminium oxide, and a conductor layer, which is arranged on that side of said insulation layer that is averted from the heat sink and is composed of an electrically conductive material, for example copper, aluminum or an aluminum alloy, may be produced on the surface of the heat sink by means of cold gas spraying. A shape of the insulation layer and/or of the conductor layer can be defined, for example, by means of a template or mask during spraying.

As a result, the layer arrangement can be shaped in such a way that the described electrical connecting path is provided between the two connection regions. In order to provide the fuse, the surface of the heat sink is not provided in a simply smooth or planar fashion, but rather is provided with two material cutouts, for example passage holes or blind holes. As a result, that portion of the body which is arranged between the material cutouts forms the bridge element on which said layer arrangement is entirely or partially produced or applied or arranged by means of the cold gas spraying. Therefore, the layer arrangement is not a microstructure of an integrated circuit on a substrate. The conductor layer is, in particular, at least 1 mm wide and/or the connecting path is at least 1 cm long.

In order to be able to extinguish an arc which can be produced when the conductor layer is melted, the layer arrangement may have an electrically insulating melting material which is arranged on the conductor layer, that is to say covers, encases or coats said conductor layer, that is to say a melting layer. In some embodiments, the melting material has a melting point in a region of above 400° C. and is porous due to the cold gas spraying. A melting layer of this kind can be provided, for example, on the basis of a quartz material (for example silicon oxide) or a ceramic as melting material and/or as a condenser for condensing a vapor of the conductor material of the conductor layer.

In order to enclose or encapsulate an arc and in order to make do with relatively small creepage distances for electrical creepage currents, the conductor layer may be completely sheathed by an insulating material along the profile of the connecting path. In other words, an insulation sleeve may be placed around the conductor layer. In order to achieve this by means of the layer arrangement, the layer arrangement may have a shell layer which is composed of an of electrically insulating material, that is to say the layer arrangement is delimited with respect to a surrounding area by the shell layer. Therefore, the shell layer rests on the conductor layer or the melting layer. In this case, the shell layer is connected to the (lower) insulation layer, which is located between the conductor layer and the surface of the heat sink, along the profile of the electrical connecting path on either side, that is to say to the right and left of the profile axis or longitudinal axis, of the connecting path. Therefore, as a result, the conductor layer is completely surrounded by the electrically insulating material.

In some embodiments, to ensure said build-up of heat in the region of the bridge element, the material cutouts may be filled with a thermally insulating material. In particular, the material cutouts may be filled with air.

In some embodiments, to adjust the tripping current intensity of the fuse to a prespecifiable threshold value, the thermal capacity in the region of the bridge element is to be defined or adjusted. To this end, the bridge element may have a thickness which is less than the thickness of the rest of the heat sink, that is to say in the region adjoining the bridge element. Here, the thickness means the dimension perpendicular to the surface of the heat sink. In other words, the bridge element can therefore be hollowed out or provided with a cutout, for example, from a rear side of the heat sink (arranged opposite the surface).

In some embodiments, to improve a cooling effect of the heat sink in the region outside the bridge element and to keep the conductor layer below a prespecified temperature value even with a current intensity of greater than 10 A, in particular greater than 50 A, here, the heat sink may have at least one cooling duct for carrying a cooling medium. In other words, the heat sink can have, for example, at least one passage opening or one hole. The temperature value can therefore lie, for example, in the range of from 50° to 400° C.

In some embodiments, to nevertheless ensure an accumulation of heat or a build-up of heat in the region of the bridge element within the conductor layer, a material of the conductor layer may be porous at least in the region of the bridge element. As a result, there is air between the electrically conductive material of the conductor layer, said air reducing a transfer of heat or a propagation of heat in comparison to a conductor layer which is formed in a solid fashion from the electrically conductive material.

The heat sink does not have to be provided solely for the conductor layer. In some embodiments, the heat sink may be additionally fitted with at least one electronic component, that is to say a total of one electrical circuit can be arranged and cooled on the heat sink. Therefore, at least one switchable electronic component, for example a transistor, is arranged on a surface of the heat sink, wherein the component is then electrically interconnected to one of said connection regions.

In some embodiments comprising a motor vehicle, an electrical voltage source, for example a battery and/or a generator, may be connected to at least one high-current load. Here, a high-current load is an electrical load which can have an operating current of greater than 10 A. A high-current load can be formed, for example, by an electrical PTC heating element (PTC—Positive Temperature Coefficient) or an electrical machine. The voltage source and the at least one high-current load are electrically connected by means of an embodiment of the circuit arrangement incorporating the teachings herein. Therefore, as a result, the described electrical connecting path, as high-current path, leads from the voltage source to the at least one electrical load or the other way around from at least one electrical high-current load to the voltage source.

The exemplary embodiment explained below is only one embodiment of the teachings herein. In the exemplary embodiment, the described components of the embodiment each represent individual features which are to be considered independently of one another and which each also develop the teachings independently of one another and can therefore also be considered to be a constituent part, either individually or in a combination other than that shown. Furthermore, further features of the teachings herein that have already been described can also be added to the described embodiment. In the figures, functionally identical elements are respectively provided with the same reference symbols.

FIG. 1 shows a motor vehicle 10 which may be, for example, an automobile, in particular a passenger car or a truck. The motor vehicle 10 can have a high-current load 11, which, in the example shown, can be an inverter of an electric machine 12. By way of example, a traction drive for the motor vehicle 10 can be provided by means of the electrical machine 12. In order to operate or supply power to the high-current load 11, said high-current load can be electrically connected to a voltage source 13, which, in the example shown, can be a battery, for example a traction battery or high-voltage battery. The high-current load 11 can also be, for example, a heating application. An operating current 14 for the high-current load 11 can be greater than 10 A, in particular greater than 50 A.

In some embodiments, to safeguard against a short circuit or another fault, a circuit arrangement 15 is provided, which circuit arrangement can provide a fuse 16 for interrupting the operating current 14 if a current intensity of the operating current 14 is greater than a predetermined threshold value. The circuit arrangement 15 can have a heat sink 17 on which the fuse 16 and the high-current load 11 can be jointly arranged, that is to say electronic components of the high-current load 11 can be integrated into the circuit arrangement 15. The fuse 16 is distributed in a flat or planar fashion and additionally reinforced by the heat sink 17. In the case of vibrations during travel of the motor vehicle 10, the fuse can therefore not be excited or escalated into natural oscillation by the vibrations.

Figure 2:
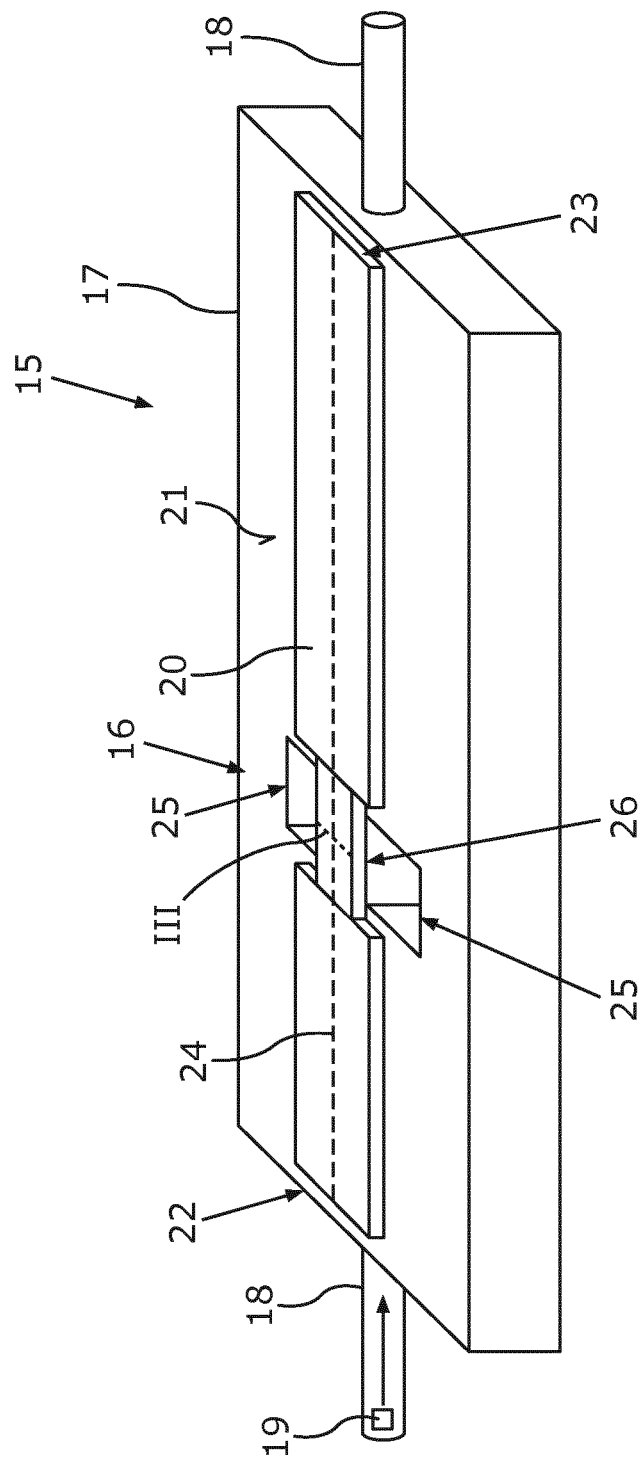
FIG. 2 shows a schematic illustration of a perspective view of a circuit arrangement of the motor vehicle from FIG. 1.

FIG. 2 illustrates the planar or flat configuration of the fuse 16. In addition, uniform cooling, that is to say avoidance of the build-up of heat (hotspots), is ensured. FIG. 2 shows the heat sink 17 which may be, for example, an injection-molded component. A material of the heat sink 17 can comprise, for example, aluminum or an aluminum alloy. By means of a cooling duct 18, a cooling medium 19 for transporting away or dissipating thermal energy from the heat sink 17 can be led or guided or flow through or past said heat sink.

The fuse 16 is formed by a layer arrangement 20 which can be arranged on a surface 21 of the heat sink 17. The layer arrangement has an electrically conductive portion, so that a first connection region 22 and a second connection region 23 are electrically connected by means of the layer arrangement 20 and this produces an electrical connecting path 24 between the connection regions 22, 23 for the operating current 14. The fuse 16 is provided by the layer arrangement 20 and the heat sink 17 along this connecting path 24. To this end, the heat sink 17 has, on its surface 21, two material cutouts 25 which, for example during manufacture of the heat sink 17, can be manufactured by a corresponding mold and/or by being milled-out or drilled-out. A bridge element 26 is formed by the remaining portion of the heat sink 17 between the material cutouts 25, it being possible for a portion of the layer arrangement 20 to be arranged on said bridge element. The layer arrangement 20 can also be configured to be narrower in the region of the bridge element 26 than on either side of the bridge element along the profile of the electrical connecting path 24, as is illustrated in FIG. 2.

Figure 3:
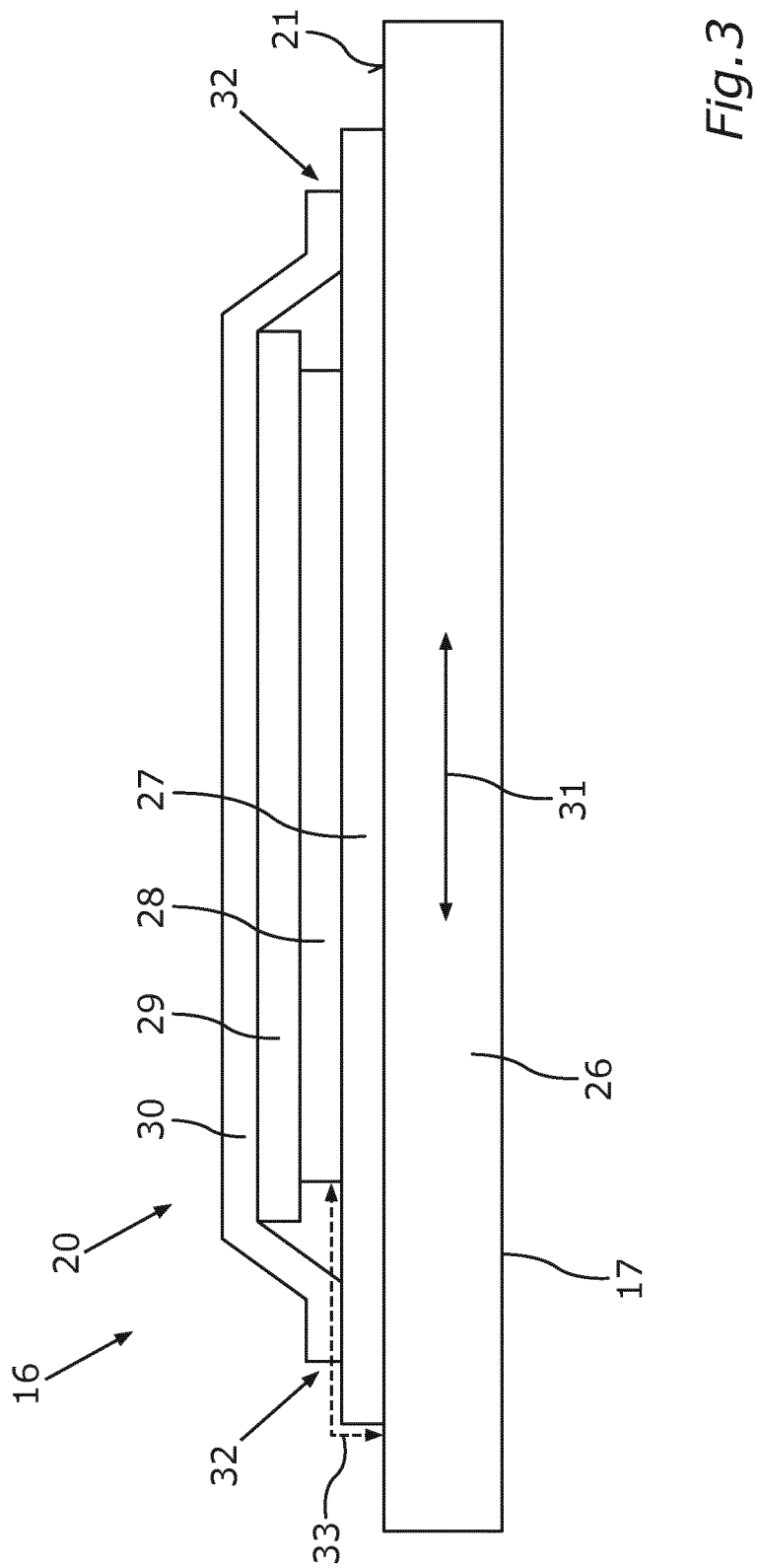
FIG. 3 shows a schematic illustration of a cross section through the circuit arrangement from FIG. 2.

FIG. 3 illustrates a cross section perpendicular in relation to the profile of the connecting path 24. The section line for the section according to FIG. 3 is identified by III in FIG. 2. Proceeding from the heat sink 17, in the illustrated example, an insulation layer 27, a conductor layer 28, a melting layer 29 and a shell layer 30 are arranged on the surface 21 of said heat sink. The layers 27, 28, 29, 30 together constitute the layer arrangement 20. A further melting layer can also be arranged between the insulation layer 27 and the conductor layer 28 in order to completely sheath the conductor layer.

In some embodiments, the layer arrangement 20 for the fuse 16 can be applied to the surface 21 of the heat sink 17 in a coating process. In particular, cold gas spraying is suitable. To this end, the electrically insulating insulation layer 27, which preferably has a melting point of greater than 700° C., in particular greater than 1000° C., is applied to the heat sink. The material used for the insulation layer 27 may be, by way of example, aluminum oxide. The material cutouts 25 which reduce the thermal connection to the remaining portion of the heat sink 17 in a targeted manner in the region of the bridge element 26 are provided in the heat sink 17. The electrically conducting or conductive conductive layer 28 which does not completely cover, that is to say partially covers, the insulation layer 27 in a transverse direction 31 transverse to the connecting path 24 and here preferably has a melting point in a range of greater than 350° C., in particular 400° C., and less than 600° C., in particular 500° C., is applied to the bridge element. The material provided may be, for example, aluminum or copper or an aluminium alloy. The melting layer 29 which is composed of an electrically insulating material which melts at temperatures preferably above 450°, in particular 500° and less than 1000° C., is applied to the conductor layer 28. Said electrically insulating material may be, for example, quartz, silicon oxide or a ceramic.

The melting layer 27 completely covers the conductor layer 28 along the transverse direction 31 and can also be wider than the conductor layer 28, that is to say protrude beyond said conductor layer along the transverse direction 31. However, the melting layer 29 remains or is narrower than the insulation layer 27 in the transverse direction 31. Finally, the shell layer 30 is applied as a protective electrically insulating outer layer. A material of the shell layer 30 can be the same as the material of the insulation layer 27. Since the shell layer 30 is wider than the melting layer 29 and the conductor layer 28, there is a material connection 32 between the shell layer 30 and the insulation layer 27, as a result of which the conductor layer 28 and the melting layer 29 are completely enclosed or surrounded by the electrically insulating material. As a result, a creepage distance 33 between the electrically conductive material of the conductor layer 28 and of the heat sink 17 can be configured to be particularly short since electrical connection via air is suppressed.

Owing to the limited thermal coupling on account of the hollow spaces of the material cutouts 25 on the heat sink 17 and the thermal mass of the bridge element 26, continuous currents in the form of the operating current 14 and brief peak currents up to a prespecified maximum current intensity per unit time keep the conductor layer 28 at a temperature lower than the melting point in the region of the bridge element 26. If, however, the current intensity of the operating current 14 rises to a defined higher current intensity value, the conductor layer 28 heats up in the region of the bridge element 26 to such an extent that the conductor layer 28 melts and an arc can be produced at the electrically interrupted point, said arc then also melting the material of the melting layer 29 and/or the evaporated conductor being deposited as condensate in the remaining portion of the porous melting layer, this in turn leading to the arc being extinguished again and the connection retaining a high resistance. Owing to the surrounding high-temperature shell in the form of the electrically insulating material of the shell layer 30 and the insulation layer 27, this process is concluded toward the outside.

In some embodiments, to adjust the thermal conductivity of the bridge element 26 in a targeted manner, the change in thickness 34 of the bridge element 26 as shown in FIG. 4 can be provided. The thickness 34 can be lower than a thickness 35 of the rest of the heat sink 17. Owing to the ability to continuously cool the conductor layer 28, there is a reduction in an aging effect due to peak currents in the layer arrangement 20. With a given current-carrying capacity, the fuse 16 can be configured to be more compact than a concentrated component. Owing to the described measures, the fuse 16 can also be readily scaled and integrated into applications as illustrated by way of example in connection with FIG. 1 by combining the circuit arrangement 15 comprising a single heat sink 17 and the fuse with the high-current load 11.

The integration into a cooled high-current path by application to the surface 21 of a heat sink 17 is advantageous because a concentrated mass does not create powerful forces at the electrical connecting points due to vibrations, as in the case of a conventional fuse, but rather the fuse is part of the current path which is integrated as a whole.

What is claimed is:

1. A fuse electrically connecting two connection regions, the fuse comprising:
   a heat sink;
   a set of layers arranged on a surface of the heat sink, the set of layers including an electrically insulating layer arranged on the heat sink and an electrically conductive conductor layer arranged on a side of the insulation layer facing away from the heat sink; and
   an electrical connecting path between the two connection regions; wherein the surface of the heat sink defines two material cutouts; and
   a portion of the heat sink arranged between the two material cutouts forms a bridge element; and
   the set of layers is disposed at least in part upon the bridge element.

2. The fuse as claimed in claim 1, wherein the set of layers includes a melting layer arranged on the electrically conductive conductor layer and composed of an electrically insulating melting material which has a melting point greater than 400° C.

3. The fuse as claimed in claim 2, wherein the melting layer is porous.

4. The fuse as claimed in claim 1, wherein:
   the set of layers includes a shell layer delimiting the set of layers with respect to a surrounding area and composed of an electrically insulating material; and
   the shell layer is connected to the insulation layer along a profile of the electrical connecting path on either side of the connecting path.

5. The fuse as claimed in claim 1, wherein the two material cutouts contain air.

6. The fuse as claimed in claim 1, wherein:
   the bridge element has a thickness measured perpendicular to the surface of the heat sink; and
   the thickness is smaller than a thickness of the heat sink in a region adjoining the bridge element.

7. The fuse as claimed in claim 1, further comprising a cooling duct for carrying a cooling medium to the heat sink.

8. The fuse as claimed in claim 1, wherein the electrically conductive conductor layer is porous in the region of the bridge element.

9. A motor vehicle comprising:
   an electrical voltage source;
   a high-current load with an operating current greater than 10 A;
   a heat sink;
   a set of layers arranged on a surface of the heat sink, the set of layers including an electrically insulating layer arranged on the heat sink and an electrically conductive conductor layer arranged on a side of the insulation layer facing away from the heat sink; and
   an electrical connecting path between connection regions; wherein the surface of the heat sink defines two material cutouts; and
   a portion of the heat sink arranged between the two material cutouts forms a bridge element;
   the set of layers is guided across the bridge element;

the voltage source and the high-current load are electrically connected by the electrical connecting path.

10. A method for manufacturing a circuit arrangement comprising a fuse, the method comprising:
applying a set of layers on a surface of a heat sink;
wherein the set of layers includes an insulation layer arranged on the heat sink and composed of an electrically insulating material and a conductor layer arranged on a side of the insulation layer facing away from the heat sink and composed of an electrically conductive material;
wherein applying the set of layers includes cold gas spraying;
wherein the set of layers includes an electrical connecting path between two connection regions;
wherein the surface of the heat sink defines two material cutouts forming a bridge element from a portion of the heat sink arranged between the two material cutouts; and
wherein the set of layers is at least partially disposed on the bridge element.

* * * * *